United States Patent

[11] 3,617,820

[72] Inventor Arno Henry Herzog
St. Louis, Mo.

[21] Appl. No. 595,363
[22] Filed Nov. 18, 1966
[45] Patented Nov. 2, 1971
[73] Assignee Monsanto Company
St. Louis, Mo.
Continuation-in-part of application Ser. No. 509,598, Nov. 24, 1965, now Patent No. 3,419,742.
The portion of the term of the patent subsequent to Dec. 31, 1985, has been disclaimed.

[54] INJECTION-LUMINESCENT DIODES
10 Claims, 3 Drawing Figs.

[52] U.S. Cl. ........ 317/234, 313/108
[51] Int. Cl. ........ H01l 9/00
[50] Field of Search ........ 317/235 (27), 235 (48.2); 313/108 D

[56] References Cited

UNITED STATES PATENTS

| | | | |
|---|---|---|---|
| 3,245,002 | 4/1966 | Hall | 317/235 |
| 3,353,051 | 11/1967 | Barrett et al. | 313/108 |
| 3,419,742 | 12/1968 | Herzog | 317/235 |
| 3,363,155 | 1/1968 | Newman | 317/235 |

OTHER REFERENCES

Proceedings of the IEEE, " Spectral Distribution of Room Temperature GaAs-Junction Luminescence as a Function of Base Thickness," by Lucovsky et al., May 1965, pp. 491–492.

*Primary Examiner*—Jerry D. Craig
*Attorneys*—John D. Upham, Herman O. Bauermeister and William I. Andress

ABSTRACT: This disclosure relates to injection-luminescent diodes of gallium arsenide, gallium phosphide and mixed binary crystals thereof having the formula $GaAs_xP_{1-x}$, where $x$ is a numerical value greater than zero and less than one, said diodes having an N-type conductivity region doped to a carrier concentration of from $10^{15}$ to $10^{19}$ carriers/cc. of N-type impurity atoms and a substantially linearly graded PN junction merging with a radiative recombination band which extends from about 5 to 25 microns into a region of P-type conductivity and is doped with P-type impurity atoms to a carrier concentration of about $4\times10^{19}$ carriers/cc. at the distal edge of said band from the PN junction. The injection-luminescent diodes of this invention are produced by a diffusion process.

INVENTOR

ARNO H. HERZOG

BY William J. Andress

ATTORNEY

INVENTOR
ARNO H. HERZOG
BY William T. Andrews
ATTORNEY

INJECTION-LUMINESCENT DIODES

This application is a continuation-in-part of applicant's U.S. application Ser. No. 509,598, filed Nov. 24, 1965, now U.S. Pat. No. 3,419,422.

The present invention relates to injection-luminescent gallium arsenide, GaAs, gallium phosphide GaP, and gallium arsenide phosphide, $GaAs_xP_{1-x}$, diodes having high external quantum efficiencies.

One aspect of this invention pertains to semiconductor components as articles of manufacture comprising single crystal GaAs, GaP or $GaAs_xP_{1-x}$ (which are mixed single crystals of GaAs and GaP and $x$ has a numerical value greater than zero and less than one) having a region of N-type conductivity doped to a carrier concentration of from $10^{15}$ to $10^{19}$ atoms/cc. of N-type impurity donor atoms ($N_D$), a graded PN junction merging with a radiative recombination band or layer which extends into a region of P-type conductivity GaAs, GaP or $GaAs_xP_{1-x}$ to a distance of up to about 25 microns and which is doped with zinc to a carrier concentration of about $4\times10^{19}$ atoms/cc. at the distal edge from said PN junction.

Another aspect of this invention pertains to injection-luminescent gallium arsenide, gallium phosphide and gallium arsenide phosphide diode devices which utilize the above-described semiconductor components to produce exceptionally high external quantum efficiencies.

Still another aspect of this invention pertains to a vapor diffusion process wherein zinc is diffused into a body of P-type GaAs, GaP or $GaAs_xP_{1-x}$ in a controlled manner to provide the novel, highly efficient injection-luminescent components and diodes of this invention.

The utility of injection-luminescent diodes in conjunction with photon-coupled devices such as photodetectors, phototransistors, oscillators, modulators, multiplexers, signal generators, photoconductors for relays, switches, electrical and optical amplifiers and the like has given rise to extensive research efforts to produce diodes having maximum external quantum efficiencies. These research efforts have resulted in the commercial production of injection-luminescent GaAs diodes having external quantum efficiencies of from 0.1 percent to 0.3 percent, (see Electronics, July 27, 1964, p. 59) which are typical of efficiencies presently found in GaAs injection-luminescent diodes.

Various materials and procedures have been described or suggested for obtaining efficient electroluminescent diodes using semiconductor materials. For example, SiC diodes having P- and N-type regions separated by a highly resistive interlayer, i.e. PIN junctions, were found by Lossev in 1923 to emit light when a forward bias was applied. Lehovec et al. in the early fifties explained light emission in SiC crystals in terms of PN injection and radiative recombination in forward-biased PN junctions. Patrick, Rucker and Fischer independently concluded that the junctions were not PN, but N*NP* junctions with a highly resistive N-layer between highly conducting N* and P*-layers. More recently, forward PN injection luminescence has been found in germanium, silicon, and III–V compounds by various workers. Keyes et al. (Proc. Insti. Radio Engrs., 50 1822 (1962) have described diodes fabricated from single crystal N-type gallium arsenide wherein a P-type layer was formed by diffusion with zinc from a dilute solution of zinc in gallium. However, no details were recited as to the specific diffusion parameters or to the zinc concentration and distribution in the N and P layers. Since the internal quantum efficiency reported was only 85 percent—at liquid nitrogen temperatures, i.e., 77° K.—the useful external quantum efficiency could not have been more than about 0.2 percent at room temperature (300° K.). Herzog and coworkers found that when zinc from a zinc arsenide source, $ZnAs_2$, is diffused into N-type gallium arsenide two junctions resulted, i.e., a fast or deeper diffusion front which is a true PN junction and a slower, shallow diffusion front which is a $P^+P$ junction. Luminescence occurred in the narrow band between these two junctions and the external quantum efficiencies (about 0.2 percent) were sufficiently high for use in commercial electroluminescent diodes, e.g., photon-coupled amplifiers.

In spite of the extensive research which has been expended on injection-luminescent diodes and the many semiconductor materials, including GaAs, which have been investigated for use in these devices, it does not appear that any commercially practicable injection-luminescent diodes having external quantum efficiencies higher than the 0.1 percent to 0.3 percent efficiencies produced in GaAs injection-luminescent devices, as mentioned above, have been developed.

It is therefore, an object of this invention to provide injection-luminescent GaAs diodes having internal quantum emission efficiencies approximately 100 percent and external quantum emission efficiencies on the order of 1.0 percent. These electroluminescent GaAs diodes have external quantum efficiencies which are on the order of 100 percent and more higher efficiencies than those commercially available—a five- to sixfold improvement. Efficiencies of the GaP and $GaAs_x$ diodes are somewhat less than that of the GaAs $P_{1-x}$ diode due to the nature of these materials, but since the radiation from these diodes is in the visible part of the spectrum, their utility is eminently suitable where visible radiation is required. Gallium arsenide diode radiation is in the infrared region of the spectrum.

It is a particular object of this invention to provide new semiconductor components from single crystal GaAs, GaP and $GaAs_xP_{1-x}$ characterized as having a region of N-type conductivity doped to a carrier concentration of from $10^{15}$ to $10^{19}$ atoms/cc. of donor impurity atoms, a graded PN junction and a region of P-type conductivity in which a radiative recombination band of zinc-doped GaAs, GaP or $GaAs_xP_{1-x}$ extends contiguously with and from said PN junction to a distance of up to about 25 microns and is doped to a carrier concentration of about $4\times10^{19}$ atoms/cc. along the radiative recombination band edge distal to said PN junction.

A further object of this invention is to provide electroluminescent GaAs, GaP and $GaAs_xP_{1-x}$ diodes which utilize the semiconductor components described in the preceding paragraph.

Still another object of this invention is to provide a controlled vapor diffusion process wherein zinc is diffused into a body of N-type GaAs,GaP or $GaAs_xP_{1-x}$ to provide a region of P-type conductivity material and a substantially linearly graded PN junction, (as measured by capacitance-voltage measurements) contiguous with a radiative recombination band which is up to about 25 microns high while maintaining a carrier concentration of zinc atoms at about $4\times10^{19}$ atoms/cc. along the distal edge of said band from said PN junction.

These and other objects will become apparent as the description of the invention proceeds.

It has now been discovered that when a body of N-type GaAs,GaP or $GaAs_xP_{1-x}$ doped to a carrier concentration of from about $10^{15}$ to $10^{19}$ atoms/cc. is subjected to a controlled vapor diffusion with zinc in such manner that the zinc concentration is maintained at a carrier concentration of about $4\times10^{19}$ atoms/cc. along a diffusion front of up to about 25 microns above the resulting PN junction there is produced an extremely efficient radiative recombination band in the P-type conductivity region which merges with the substantially linearly graded PN junction. Maximum external quantum efficiencies result when this radiative recombination band about 15 microns in height, hence the preferred height is from about 8 to 17 microns.

In the preferred embodiment of this invention, a wafer of single crystal N-type GaAs doped to a carrier concentration of from $10^{15}$ to $10^{19}$ atoms/cc. with tin is subjected to a controlled vapor diffusion with a zinc-gallium alloy under such conditions of time and temperature that the surface concentration of zinc atoms is maintained at about $4\times10^{19}$ atoms/cc. and the PN junction depth is up to about 25 microns below the surface of the wafer in the P-type layer formed. In this embodiment, the PN junction is substantially linearly graded and merges with a highly efficient radiative recombination band or layer in the P-type conductivity region which is defined by the function depth. This embodiment is more particularly described in Examples 1 and 4 below having reference to FIG. 1.

In another embodiment of this invention the zinc diffusion is carried out with zinc arsenide as the diffusant. In this diffusion the surface (or limiting) concentration of zinc atoms is on the order of $10^{20}$ atoms/cc. and results in the production of two junctions. The fast diffusion front is an initially true nongraded PN junction and the slower front is a $P^+P$ junction due to relatively sharp change in zinc concentration between the $P^+$-type region 10 (above the $P^+P$ junction) and the P-type region 7 (between the $P^+P$ and PN junctions) FIGS. 2 and 3. In this embodiment, it is necessary to adjust the diffusion conditions of time and temperature in such manner that the zinc concentration at the $P^+P$ junction is maintained at about $4\times10^{19}$ atoms/cc. and the distance between the $P^+P$ and PN junctions is maintained at less than about 25 microns. Under these conditions the PN junction becomes graded. Examples 2 and 3 below more fully illustrate this embodiment having reference to FIG. 2.

Figure 1:
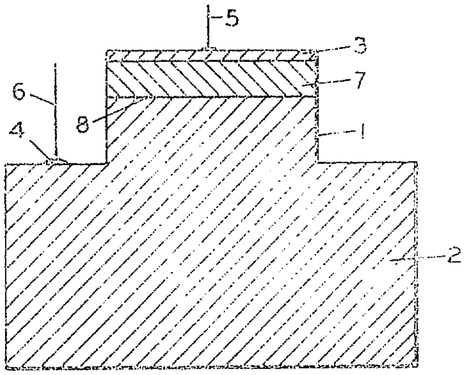
FIG. 1 is a schematic drawing of the preferred embodiment of the invention wherein the entire P-type surface layer of the injection-luminescent diode is a radiative recombination band.
Figure 2:
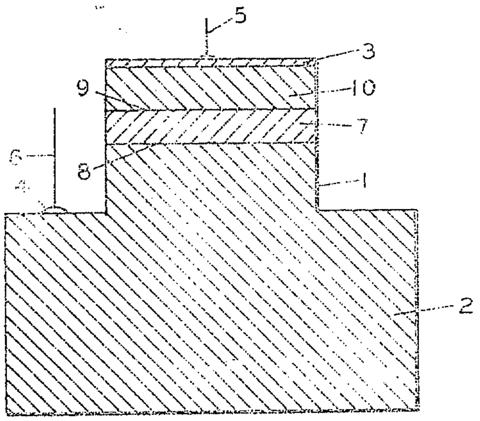
FIG. 2 is a schematic drawing of an embodiment of the invention wherein an injection-luminescent radiative recombination band having an upper $P^+P$ junction and a lower PN junction is formed internally of the P-type region of the diode.
Figure 3:
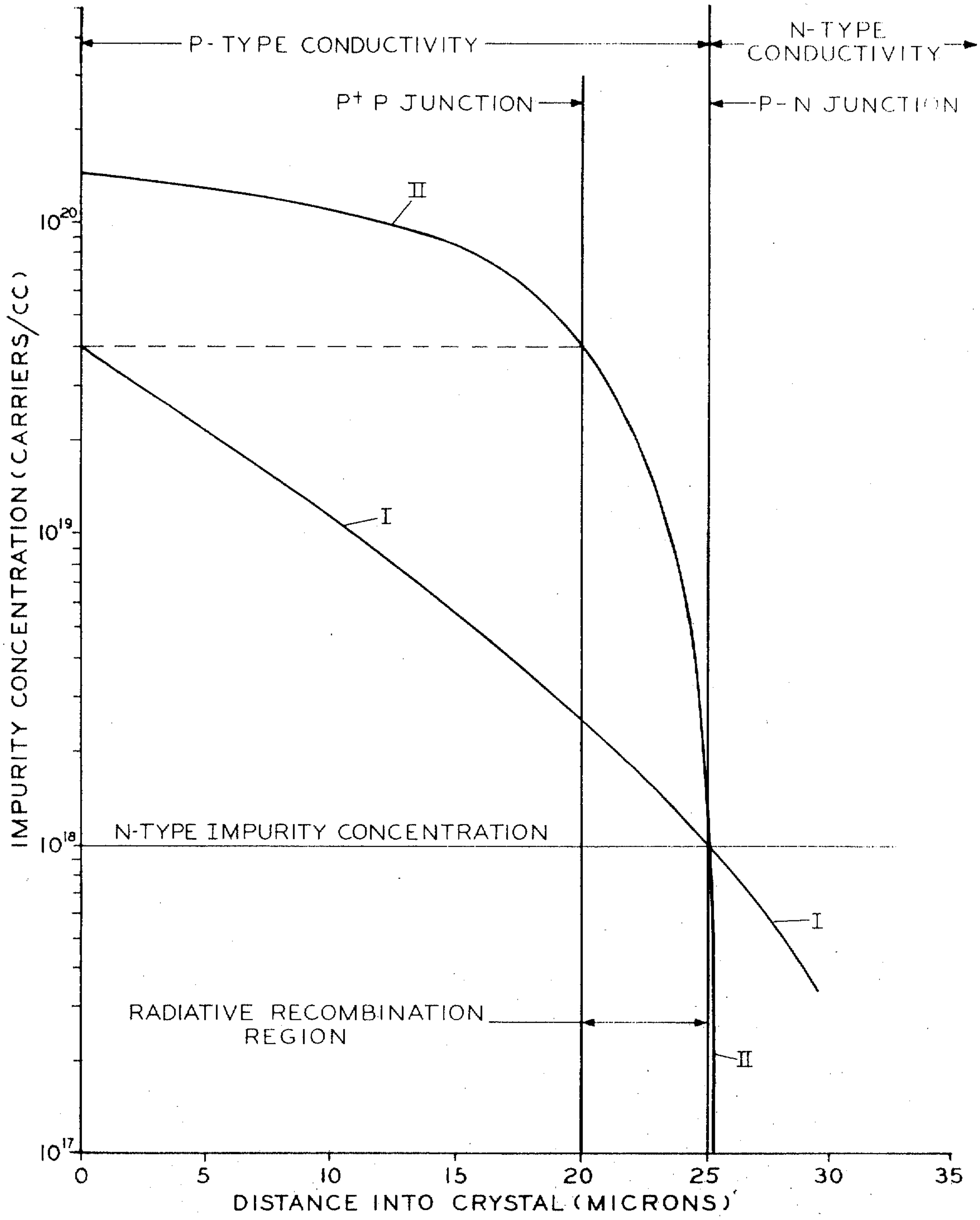
FIG. 3 is a graph showing a schematic representation of impurity concentration gradient curves I and II plotted against crystal depth for the injection luminescent diode embodiments shown in FIGS. 1 and 2, respectively.

The impurity concentration gradients of the P-type impurity atoms diffused into the N-type starting diode material to produce the diode embodiments shown in FIGS. 1 and 2 are schematically represented in FIG. 3 by curves I and II, respectively. In the injection-luminescent diode embodiment of FIG. 1, the entire P-region above the PN junction 8 forms the radiative recombination band or region 7. The surface or limiting concentration of P-type impurities is about $4\times10^{19}$ carriers/cc. and, as shown by curve I in FIG. 3, the impurity concentration gradient is substantially linearly graded through the P-region and the PN junction (25 microns below the crystal surface and below which the N-type impurity concentration is represented as being $10^{18}$ carriers/cc.). In the injection-luminescent diode embodiment of FIG. 2, the impurity concentration gradient is represented by curve II in FIG. 3. In this embodiment, two diffusion fronts are formed; the deeper diffusion front forms the PN junction 8, 25 microns below the crystal surface and the slower more shallow diffusion front forms a $P^+P$ junction 9 (FIG. 2). The slower diffusion front, about 20 microns below the crystal surface, is apparent as the "knee" in curve II of FIG. 3 and is due to a relatively sharp change in concentration of the P-type impurity at about the $4\times10^{19}$ carrier/cc. level (shown by the dotted line). The distance between the diffusion fronts, or the $P^+P$ and PN junctions, is represented as about 5 microns in FIG. 3 and represents the internal radiative recombination band or region 7 shown in FIG. 2. The surface concentration of P-type impurity atoms is on the order of $10^{20}$ carriers/cc. as shown in FIG. 3.

EXAMPLE 1

This example illustrates the preferred embodiment of this invention for the production of injection-luminescent GaAs diodes wherein the diffusant is a zinc-gallium alloy.

An etch-polished wafer of GaAs, doped with tin to a carrier concentration of $1.7\times10^{18}$ atoms/cc. was diffused at 850° C. for 14.5 hours in a 10 ml. evacuated quartz ampul containing 97 mg. of gallium and 3 mg. of zinc. Under these conditions the surface zinc concentration was maintained at about $4\times10^{19}$ atoms/cc. during the diffusion.

The zinc-diffused GaAs was then cleaved on a <110> 90° cleavage plane and etched with $HF:HNO_3:H_2O$ (1:3:4) solution for 10 seconds to develop the diffusion junction. This junction was 11.7 microns deep and shown by capacity-voltage measurements to be a substantially linearly graded PN junction.

Diode mesas 1 having an area of $11.25\times10^{14}$ cm.$^2$ and a height of 29 microns were etched on the (111)B face and the (111)A face lapped and polished to a thickness of 173 microns. An evaporated gold-zinc film 3 was alloyed to the P-type mesa top and a gold-tin-antimony contact 4 alloyed to the N-type base of the mesa. Electrical leads 5 and 6 were attached to contacts 3 and 4, respectively, and a 20 ma. DC current was passed through the diode with the N-type side 2 of the diode placed on the face of a solar cell (not shown) enclosed in a lightproof box. The external quantum efficiency was measured as solar cell current × 100/diode current and in this example: 0.1296×100/20=0.648 percent. When this measured efficiency is corrected by a standard solar cell efficiency factor of 0.7 the absolute external quantum efficiency is found to be 0.925 percent (0.6480.7).

The diode produced in this example had the following physical and electrical properties:

| | |
|---|---|
| Junction depth | 11.7 microns |
| Capacity | 7.2 x $10^{-8}$ F/cm$^2$ |
| Voltage breakdown | 8.6 volts (sharp) |
| Built-in voltage | 1.03 volts |
| Junction characteristic | 3.16 |

The junction characteristic ($n$) is determined from capacitance-voltage measurements. The efficiency of a diode is a direct function of the junction characteristic. Experimental data indicates that the efficiency increases when going from an abrupt junction ($n$=2) to a linear junction ($n$=3).

In accordance with the diffusion process of this embodiment zinc-gallium alloys containing less than about 10 percent zinc are suitable. Diffusion times may range from about 3 hours at the higher levels of said zinc concentrations to about 21 hours for lower zinc concentration levels when conducted at about 850° C. Of course, at higher temperatures diffusion times will be reduced. In general, it is preferred that diffusion temperatures be within the range of from 750° to 950°and still more preferably between about 825° C. to 875° C.

In this example the entire layer of P-type conductivity GaAs is the radiative recombination band the height of which is measured by the depth of the PN junction 8 from the surface of the P-layer. This will be the case in all modifications of this particular embodiment so long as the limiting zinc concentration is maintained at about $4\times10^{19}$ atoms/cc. and the junction depth is up to about 25 microns. The significance and criticality of the junction depth (i.e., radiative recombination band height) limitation is that when the junction depth increases beyond the specified limit the recombination lifetime near the PN junction increases and thereby reduces the electroluminescent efficiency. On the other hand, when the PN junction depth is less than about 1 micron from the P-surface the radiative recombination band becomes too shallow to accommodate the necessary quantum of injected carrier recombinations to produce practical emission efficiencies.

EXAMPLE 2

This example illustrates an embodiment of the invention wherein a highly efficient radiative recombination band is formed internally of the P-type layer of a body GaAs having a PN junction.

The apparatus and procedure set forth in the preceding example is followed except for the diffusion process. Here, a wafer of N-type GaAs doped to a carrier concentration of about $10^{18}$ atoms/cc. is diffused with about 6 mg. of zinc arsenide at a temperature of approximately 1,000° C. for about 5 minutes.

After the diffusion operation two distinct junctions are observed. The lower PN junction 8 is about 40 microns below the P-surface and the upper $P^+P$ junction 9 about 35 microns below the P-surface the region 10 in FIG. 2 is designated as the $P^{115}$-region. The resulting radiative recombination band 7 is approximately 5 microns high and the upper edge at the $P^+P$ junction is doped to a zinc concentration of about $4\times10^{19}$ atoms/cc. The external efficiency of this diode is about 0.6 percent. Efficiencies can be further increased by adjusting the diffusion conditions to increase the height of the radiative recombination band, i.e., the distance between the $P^+P$ and PN junctions.

EXAMPLE 3

This example illustrates an embodiment of the invention wherein a highly efficient radiative recombination band is formed internally of the P-type conductivity layer of a body of GaP having a PN junction.

When zinc is diffused into a single crystal of N-type GaP to form a PN junction, green light can be obtained from this junction by placing an external voltage source across this junction, i.e., operating the PN junction as a forward biased diode, as was done for GaAs in example 1.

The apparatus and procedure set forth in the preceding examples is followed except that the crystal is GaP. The diffusion process is similar to that in example 2. Here, a wafer of N-type GaP with a net carrier concentration of $6\times10^{16}$, with the major donors being sulfur, is diffused with about 6 mg. of zinc arsenide at a temperature of 800° C. When relatively short diffusion times such as 10 minutes are employed, an approximately sharp or step junction is produced as measured by a low value of ($n$) calculated from the capacitance-voltage data, and relatively poor quantum efficiency is obtained. When the diffusion times are increased to 1 hour, the zinc concentration gradient on the P-side of the PN junction approaches a linear graded condition (as measured by the junction characteristic ($n$) approaching a value of 3; with a zinc concentration of $4\times10^{19}$ atoms/cc. at the upper edge of the gradient) and the efficient radiative recombination band becomes wider; the quantum efficiency is greatly increased. Increasing the factor ($n$) from 2.0 to 2.8 increases the externally measured quantum efficiency by a factor of 6.

EXAMPLE 4

This example illustrates the preferred embodiment of this invention for the production of injection-luminescent gallium arsenide phosphide diodes wherein the diffusant is a zinc-gallium alloy.

An etch-polished wafer of $GaAs_{0.67}P_{0.33}$ doped with Se to a carrier concentration of $9.4\times10^{16}$ atoms/cc. was diffused at 850° C. for 4.5 hrs. in a 10 ml. evacuated quartz ampul containing 96 mg. of gallium and 4 mg. of zinc. Under these conditions the surface zinc concentration was maintained at about $4\times10^{19}$ atoms/cc. during the diffusion and the PN junction depth was 14 microns.

A piece of the same wafer was diffused by the standard zinc diffusion process of placing 8 mg. of $ZnAs_2$ in a 10 ml. evacuated ampul containing the sample and heating for about 20 minutes at 875° C., thus producing a relatively abrupt PN junction about 11 microns below the surface. The surface concentration is on the order of $10^{20}$ zinc atoms/cc.

When evaluation measurements described in example 1 are applied to these two samples, it is found that as in the GaAs sample of example 1, the Zn-Ga alloy diffused sample has a more graded junction (a wide efficient radiative recombination band) and that the alloy diffused sample has an efficiency of 0.038 percent as compared to the 0.027 percent for the standard ($ZnAs_2$) diffusion sample.

A gallium arsenide phosphide sample of the above composition emits radiation in the visible (red) spectrum ($\approx0.690\mu$). The luminescence generated in this embodiment of this invention relating high quantum efficiency to a wide efficient radiative recombination band can be directly detected by the human eye. The alloy-diffused sample with the graded junction can be seen to be much brighter than the other sample, when operated as a forward-biased diode.

As mentioned above, the injection-luminescent gallium arsenide, gallium phosphide and gallium arsenide phosphide diodes of the present invention must contain an impurity concentration of from $10^{15}$ to $10^{19}$ carriers/cc. in the N-type region of the diode material. In the above examples, tin, sulfur and selenium were illustrated as preferred N-type donors. Other N-type donors satisfactorily used herein include tellurium, carbon, silicon, germanium and combinations thereof. Of course, diffusion conditions and quantum efficiencies will vary somewhat depending upon the material and the donor used. In like manner while the invention has been illustrated by the use of zinc arsenide and zinc-gallium alloys it is within the purview of this invention that other sources of zinc may be used at diffusion temperatures, times and zinc concentrations corresponding to the above specified zinc concentration limitations. It is also contemplated that other P-type dopants such as magnesium and cadmium may be used in place of zinc herein.

Injection-luminescent diodes fabricated from the single crystal GaAs semiconductor components produced herein have internal quantum emission efficiencies of approximately 100 percent and measured external quantum efficiencies on the order of 1.0 percent when operated at room temperature and at a current density of 20 A/cm². It is well known of course that in general external efficiencies can be improved still further by operating at higher current densities and by use of antireflex coatings or geometrical devices such as hemispherical lens or Weierstrasse spheres.

Variations and modifications of the instant invention will occur to those skilled in the art without departing from the spirit and scope thereof.

What is claimed is:

1. As a composition of matter injection-luminescent materials comprising a body selected from the group consisting of single crystal, gallium phosphide and mixed crystals thereof with gallium arsenide and having the formula $GaAs_xP_{1-x}$ where $x$ is a numerical value greater than zero and less than one and having a region of N-type conductivity doped to a carrier concentration of from $10^{15}$ to $10^{19}$ atoms/cc. of N-type impurity atoms, a substantially linear graded PN junction merging with a radiative recombination band which extends up to about 25 microns into a region of P-type conductivity and is doped with zinc to a carrier concentration of about $4\times10^{19}$ atoms/cc. along the distal edge from said PN junction.

2. Composition according to claim 1 wherein said injection-luminescent material is gallium phosphide.

3. Composition according to claim 1 wherein said injection-luminescent material is gallium arsenide phosphide, $GaAs_xP_{1-x}$, where $x$ is a numerical value greater than zero and less than one.

4. Composition according to claim 1 wherein said radiation recombination band extends from about 8 to 17 microns above the PN junction into said region of P-type conductivity.

5. As an article of manufacture an injection-luminescent diode comprising a body selected from the group consisting of single crystal, gallium phosphide and mixed single crystals thereof with gallium arsenide and having the formula $GaAs_xP_{1-x}$ where $x$ is a numerical value greater than zero and less than one and having a region of N-type conductivity doped to a carrier concentration of from $10^{15}$ to $10^{19}$ atoms/cc. of N-type impurity atoms, a substantially linear graded PN junction merging with a radiative recombination band which extends up to about 25 microns into a region of P-type conductivity and is doped with zinc to a carrier concentration of about $4\times10^{19}$ atoms/cc. along the distal edge from said PN junction and electrical leads attached to said N- and P-type conductivity regions.

6. Article according to claim 5 wherein said body is gallium phosphide.

7. Article according to claim 5 wherein said body is gallium arsenide phosphide, $GaSa_xP_{1-x}$, where $x$ is a numerical value greater than zero and less than one.

8. Article according to claim 5 wherein said recombination band extends from about 8 to 17 microns above the PN junction into said region of P-type conductivity.

9. As an article of manufacture an injection-luminescent diode comprising a body selected from the group consisting of gallium phosphide and mixed crystals thereof with gallium arsenide having the formula $GaAs_xP_{1-x}$, where $x$ is a numerical value greater than zero and less than one and having a region of Nttype conductivity doped to a carrier concentration of from $10^{15}$ to $10^{19}$ atoms/cc. of N-type impurity atoms, a graded PN junction merging with a radiative recombination band which extends from 5 to 25 microns into a region of P-type conductivity wherein the distal edge of said band from said PN junction is doped to a carrier concentration of about $4\times10^{19}$ atoms/cc. of P-type impurities and forms a $P^+P$ junction with a $P^+$-type region having a surface concentration of about $10^{20}$ atoms/cc. of P-type impurities and electrical leads attached to said N-and $P^+$-type regions.

10. Article according to claim 9 wherein said radiative recombination band extends from 8 to 17 microns above said PN junction into said region of P-type conductivity.

* * * * *